United States Patent
Dykstra

(10) Patent No.: US 6,770,874 B2
(45) Date of Patent: Aug. 3, 2004

(54) GAS CLUSTER ION BEAM SIZE DIAGNOSTICS AND WORKPIECE PROCESSING

(75) Inventor: Jerald P. Dykstra, Austin, TX (US)

(73) Assignee: Epion Corporation, Billerica, MA (US)

(*) Notice: Subject to any disclaimer, the term of this patent is extended or adjusted under 35 U.S.C. 154(b) by 164 days.

(21) Appl. No.: 09/905,536

(22) Filed: Jul. 13, 2001

(65) Prior Publication Data
US 2002/0036261 A1 Mar. 28, 2002

Related U.S. Application Data
(60) Provisional application No. 60/218,247, filed on Jul. 14, 2000.

(51) Int. Cl.[7] ............................................. B01D 59/44
(52) U.S. Cl. .................................. 250/287; 250/492.2
(58) Field of Search ............................. 250/287, 492.2; 427/450; 204/192.1; 156/345.1

(56) References Cited

U.S. PATENT DOCUMENTS

| | | | |
|---|---|---|---|
| 3,634,683 A | * 1/1972 | Bakker | 250/41.9 |
| 4,737,637 A | 4/1988 | Knauer | 250/281 |
| 4,849,641 A | * 7/1989 | Berkowitz | 250/492.2 |
| 5,111,042 A | 5/1992 | Sullivan et al. | 250/251 |
| 5,166,521 A | 11/1992 | Hayashi et al. | 250/309 |
| 5,185,287 A | 2/1993 | Aoyagi et al. | 437/105 |
| 5,459,326 A | 10/1995 | Yamada | 250/398 |
| 5,770,857 A | 6/1998 | Fuerstenau et al. | 250/281 |
| 5,814,194 A | 9/1998 | Deguchi et al. | |
| 6,207,282 B1 | 3/2001 | Deguchi et al. | |
| 6,331,227 B1 | * 12/2001 | Dykstra et al. | 156/345.1 |

FOREIGN PATENT DOCUMENTS

| | | |
|---|---|---|
| DE | 4135504 A1 | 10/1991 |
| JP | 62112777 A1 | 11/1985 |
| JP | 03245523 A | 11/1991 |

OTHER PUBLICATIONS

N. Kofuji, et al., "Development of Gas Cluster Source and its Characteristics", Proc. 14th Symp. on Ion Sources and Ion-Assisted Technology, Tokyo (1991) @ pp. 15–18.

Yamada, et al., "Cluster Ion Beam Processing", Matl. Science in Semiconductor Processing I, (1998) @ pp. 27–41.

N. Toyoda et al., "Cluster Size Measurement of Large Ar Cluster Ions with Time of Flight", Proc. 1998 Intl. Conf. On Ion Implantation Technology, (1998) @ pp. 1234–1237.

P. Milani, et al., "Plasma Cluster Beam Sources for Thin Film Deposition", AIP Conf. Proc. CP392. Part I, (1997) @ pp. 495–498.

* cited by examiner

Primary Examiner—Hai Pham
Assistant Examiner—Lam Nguyen
(74) Attorney, Agent, or Firm—Perkins Smith & Cohen LLP; Jerry Cohen; Jacob N. Erlich

(57) ABSTRACT

The invention provides methods and apparatus for measuring the distribution of cluster ion sizes in a gas cluster ion beam (GCIB) and for determining the mass distribution and mass flow of cluster ions in a GCIB processing system without necessitating the rejection of a portion of the beam through magnetic or electrostatic mass analysis. The invention uses time-of-flight measurement to estimate or monitor cluster ion size distribution either before or during processing of a workpiece. The measured information is displayed and incorporated in automated control of a GCIB processing system.

32 Claims, 8 Drawing Sheets

GAS CLUSTER ION BEAM SIZE DIAGNOSTICS AND WORKPIECE PROCESSING

CROSS REFERENCE TO RELATED PATENT APPLICATIONS

This application claims priority of U.S. Provisional Application Serial No. 60/218,247 entitled GAS CLUSTER ION BEAM CLUSTER SIZE DIAGNOSTIC, filed Jul. 14, 2000, the provisional application being incorporated herein by reference.

BACKGROUND OF THE INVENTION

This invention relates generally to the measurement of the size distribution of gas clusters in gas cluster ion beams, and, more particularly to apparatus and methods for the measurement of the size distribution of gas clusters concurrently with workpiece processing.

The use of a gas cluster ion beam (GCIB) for etching, cleaning, and smoothing of material surfaces is known (see for example, U.S. Pat. No. 5,814,194, Deguchi et al.) in the art. For purposes of this discussion, gas clusters are nano-sized aggregates of materials that are gaseous under conditions of standard temperature and pressure. Such clusters typically consist of aggregates of from a few to several thousand molecules loosely bound to form the cluster. Such clusters can be ionized by electron bombardment or other means, permitting them to be formed into directed beams of known and controllable energy. The larger sized clusters are the most useful because of their ability to carry substantial energy per cluster ion, while yet having only modest energy per molecule. The clusters disintegrate on impact, with each individual molecule carrying only a small fraction of the total cluster energy. Consequently the impact effects of large clusters are substantial, but are limited to a very shallow surface region. This makes ion clusters effective for a variety of surface modification processes, without the tendency to produce deeper subsurface damage characteristic of monomer ion beam processing.

Means for creation of and acceleration of such GCIB's are described in the reference (U.S. Pat. No. 5,814,194) previously cited. Presently available ion cluster sources produce clusters ions having a wide distribution of sizes, N (where N=the number of molecules in each cluster—in the case of monatomic gases, an atom of the monatomic gas will be referred to as a molecule and an ionized atom of such a monatomic gas will be referred to as a molecular ion throughout this discussion).

To a first order approximation, the surface modification effects of an energetic cluster is dependent on the energy of the cluster. However, second order effects are dependent on the velocity of the cluster which is dependent on both the energy of the cluster and it's mass (and hence the cluster size, N.) In order to maximize the utility of a gas cluster ion beam for surface processing, it is useful to know and control both the energy of the cluster and the cluster size or cluster size distribution. In certain applications gas cluster ion beams are used for deposition or growth of surface films. When thus used it is important to know the mass flow to the workpiece. However, unless the average size or size distribution (average mass or mass distribution) is also known, the total mass flow to the workpiece is not known. In the usual case, ionized clusters from a practical ionized cluster source, do not necessarily all carry the same number of electrical charges. Under certain conditions it can be arranged that the cluster ions predominately carry a single electrical charge, and in such case it is accurately assumed that each charge corresponds to a single cluster, but unless the average size or size distribution (average mass or mass distribution) is also known, the total mass flow to the workpiece is not known. It is possible, by controlling the source conditions, to influence the ratio of cluster ions to molecular ions and as well as to influence the cluster size distribution. However, unless a means is available to measure and monitor the cluster size distribution and the ratio of cluster ions to molecular ions, optimal adjustment and control of the source conditions for influencing ionized cluster size is difficult. When the ionized clusters do not all predominately carry a single charge or a known number of charges, knowledge of the ionized clusters' mass per charge can also be used as a useful parameter to control or adjust the beam's effectiveness for smoothing, etching, or other processing.

For these and other reasons it is useful to have a means of measurement that can provide cluster size distribution information about a gas cluster ion beam or that can provide information about a gas cluster ion beam's cluster-size-per-charge distribution or cluster-mass-per-charge distribution.

Because molecular ions, as well as cluster ions, are produced by presently available cluster ion beam sources, those molecular ions are accelerated and transported to the workpiece being processed along with the cluster ions. Molecular ions, having high energy with low mass results in high velocities, which allow the light molecular ions to penetrate the surface and produce deep damage which is likely to be detrimental to the process.

It has become known in the ion cluster beam art that many GCIB processes benefit from incorporating means within GCIB processing equipment for eliminating molecular ions from the ion cluster beams. Electrostatic (see U.S. Pat. No. 4,737,637, Knauer) and electromagnetic (see Japanese laid open application JP 03-245523, cited as prior art in U.S. Pat. No. 5,185,287, Aoyagi et al.) mass analyzers have been employed to remove light ions from the beam of heavier cluster ions. Electrostatic and electromagnetic mass analyzers have also been employed to select ion clusters having a narrow range of ion masses from a beam containing a wider distribution of masses.

Presently practical GCIB sources produce a broad distribution of ion cluster sizes with limited cluster ion currents available. Therefore it is not practical to perform GCICB processing by selecting a single cluster size or a narrow range of cluster sizes since the available fluence of such a beam is too low for productive processing. It is preferred to eliminate only the molecular ions and other lowest mass ions from the beam and use all remaining heavier ions for processing. Practical experience has shown that it is often sufficient to provide filtering to eliminate molecular ions while depending on the typical cluster size distribution characteristics (few small size clusters are created by typical sources) to limit the small clusters (N=2 to ~10) in the beam. Clusters of size N>10 are adequately large to provide acceptable results in most processes. Since the typical cluster distribution contains clusters of up to N=several thousand and there are few clusters of mass less than 100, it is not significantly detrimental if clusters up to size 100 are removed from the beam in the process of eliminating the molecular ions. However, in order to adequately predict the processing effectiveness of a gas cluster ion beam, it is very desirable to know the distribution of masses or cluster sizes in the beam and to know whether molecular ions and the smallest size cluster ions are present or not.

It is therefore an object of this invention to provide a way of measuring the distribution of cluster ion sizes in a GCIB.

It is also an object of the invention to provide means to determine the mass distribution and mass flow of cluster ions in a GCIB.

It is also an object of the invention to determine the presence or absence in a GCIB of undesirable molecular ions.

It is still another object of this invention to perform cluster size and mass measurement concurrently with workpiece processing.

SUMMARY OF THE INVENTION

The objects set forth above as well as further and other objects and advantages of the present invention are achieved by the embodiments of the invention described hereinbelow.

In the present invention it is preferably arranged that the molecular and cluster ions produced in an ionization system for gas clusters predominantly carry a single electrical charge and such ions are accelerated through a known acceleration potential. Based thereon, the ions, both molecular ions and cluster ions, in a GCIB produced in the apparatus of the invention have known and controllable energies per ion, regardless of cluster size or whether the ion is a cluster or a molecular ion. Since the ions are all generated from a pure gas, the molecular weight of each molecule is known. Therefore, by measuring the times-of-flight of the known ions of known energy over a known distance, it is possible according to the invention to calculate the mass and the cluster size of the ions. Alternatively, when it is not practical or not desired to arrange that all molecular and cluster ions produced in the gas cluster ionization system predominately carry a single electrical charge, in the present invention, by measuring the times-of-flight of the ions it is possible to calculate the mass per charge or size per charge of the ions.

By providing a selected scanning waveform and introducing appropriate sensing apparatus in a conventional GCIB processor, the invention makes an in situ capability for measurement of the mass and cluster size distribution of the ions in a GCIB. The invention separates the GCIB pathway for processing from the GCIB pathway for mass and size measurement, making it possible to perform the cluster size and mass measurement concurrently with workpiece processing.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
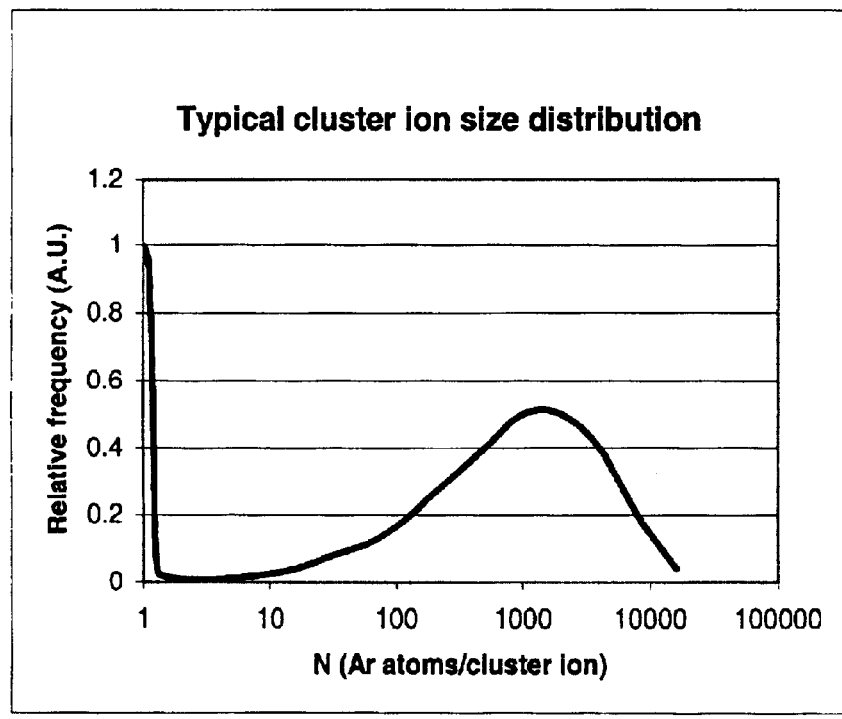
FIG. 1 is a graph showing typical ion cluster size distribution for a GICB source.

FIG. 1 shows the typical ion cluster size distribution produced by a commonly available GCIB source. The cluster formation process has been shown (in N. Kofuji, et al., Development of gas cluster source and its characteristics, *Proc. 14th Symp. on Ion Sources and Ion-Assisted Technology*, Tokyo (1991) p. 15) to produce few small size clusters (values of N from 2 to about 10), but molecular ions (N=1) are produced in abundance as are larger clusters (N>a few tens, up to a few thousands.) It is known from the teachings of U.S. Pat. No. 5,459,326, Yamada, that molecules in a cluster are not individually energetic enough (on the order of a few electron volts) to significantly penetrate a surface to cause the residual surface damage typically associated with the other types of ion beam processing in which individual molecular ions may have energies on the order of thousands of electron volts. Nevertheless, according to Yamada and Matsuo, Cluster ion beam processing, *Matl. Science in Semiconductor Processing I*, (1998) pp. 27–41, the clusters themselves can be made sufficiently energetic (some thousands of electron volts), to effectively etch, smooth or clean surfaces.

Figure 2:
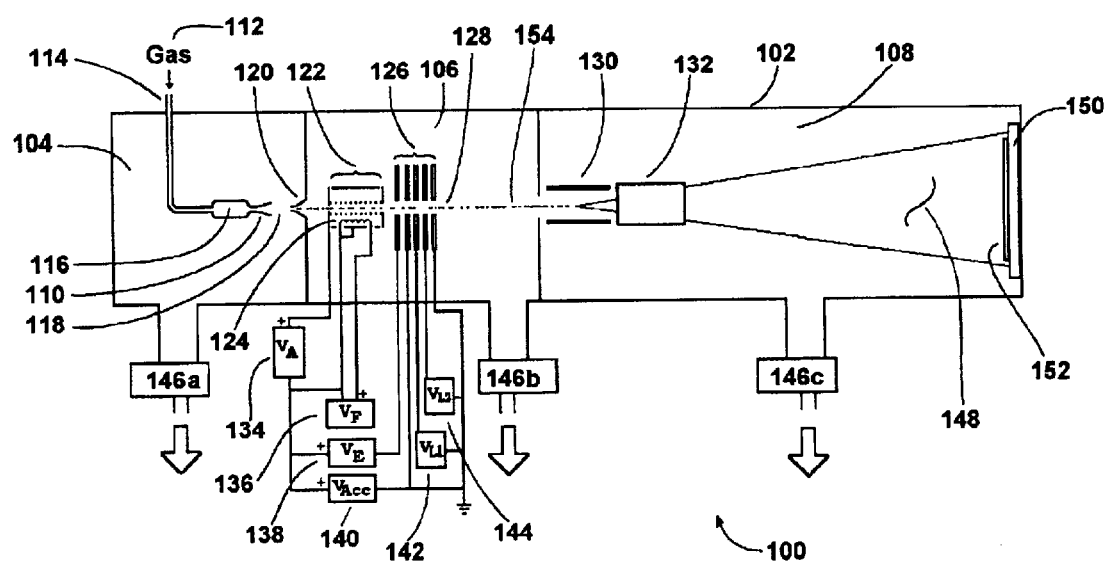
FIG. 2 is a schematic showing the basic elements of a prior art GCIB processing system.

FIG. 2 shows a typical configuration for a GCIB processor 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) is admitted under pressure through gas feed tube 114 to stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from a few to several thousand weakly bound molecules. A gas skimmer aperture 120 separates the gas products that have not been formed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not limited to argon, nitrogen, carbon dioxide, oxygen.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128 having an initial trajectory 154. Filament power supply 136 provides voltage $V_F$ to heat the ionizer filament 124. Anode power supply 134 provides voltage $V_A$ to accelerate thermoelectrons emitted from filament 124 to cause them to bombard the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{ACC}$ to bias a high voltage electrode with respect to the ionizer 122 so as to result in a total GCIB acceleration potential equal to $V_{ACC}$. One or more lens power supplies (142 and 144 shown for example) may be provided to bias high voltage electrodes with potentials ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 3:
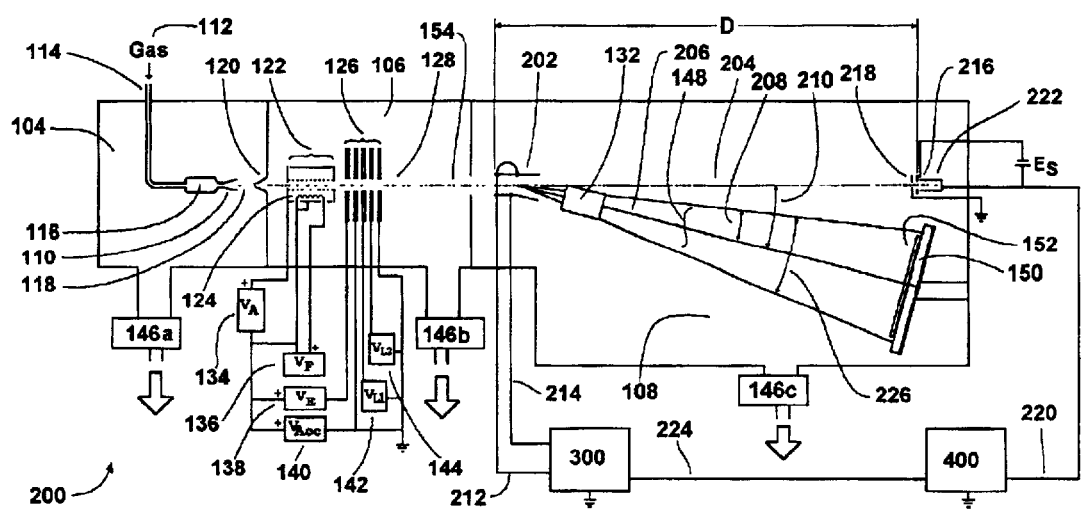
FIG. 3 is a schematic showing a GCIB processing system employing an embodiment of this invention.

FIG. 3 shows one possible embodiment of the invention utilizing of a basic GCIB apparatus 200 having a modified configuration to implement the invention. In this embodiment, a fixed (DC) deflection voltage has been added to the beam scanning voltage waveforms at the Y-scan deflection plates 202 to impose a fixed offset angle 210 between the initial beam trajectory 154 and the central path 206 of the scanned GCIB 148, the offset being imposed in the region between the scan plates 202. At scan plates 202, in addition to being deflected in the amount of offset angle 210, the GCIB also is scanned through a scanning angle 226. One half of the scan angle 226 is referred to as the scan half angle 208. Any uncharged molecules or clusters that may be present in the GCIB, are not responsive to the electrostatic field between scan plates 202, and continue in a straight line along path 204, which extends to a region now separated from the workpiece 152 processing region. A Faraday enclosure 222 having a suppressor ring electrode 216 and a grounded ring electrode 218 at the beam entrance opening of the Faraday enclosure 222 is disposed in the path of the straight line path 204, which is an extension of the initial beam trajectory 154. The suppressor ring electrode 216 is negatively biased with respect to the Faraday enclosure 222 by a bias power supply, $E_S$, so as to permit entrance of any energetic ions or uncharged particles traveling along path 204 with minimal influence, but yet also prevent the exit of low energy electrons, thus retaining all secondary electrons that may be produced in the Faraday enclosure 222. Thus, if any uncharged molecules or clusters are stopped in the Faraday enclosure 222, they have no electrical effect, but any ions that are stopped in the Faraday enclosure have their charged conducted by lead 220 to a time-of-flight analysis system 400. Workpiece 152 is held and positioned in the path of the scanned GCIB 148 and away from the Faraday enclosure 222 and the undeflected path 204 by workpiece holder 150.

Still referring to FIG. 3, the beam entrance to scan plates 202 is separated from the entrance to the Faraday enclosure 222 by a drift distance, D, which may be any convenient distance, preferably many times greater than the length of scan plates 202 and also preferably greater than 30 cm. A scan generator 300 provides y-axis scanning voltages and deflection voltages to scan plates 202 through leads 212 and 214. Scan generator 300 also provides synchronization pulses to the time-of-flight analysis system 400 through lead 224.

FIG. 3 further shows, for purposes of example, but not for limitation, a fixed angular deflection of the central path 206 from the scanned GCIB 148 of approximately 15 degrees from the initial beam trajectory 154 and its extended undeflected path 204, however, it is apparent that any deflection slightly larger than the scan half-angle 208 is potentially adequate to separate the scanned GCIB 148 from the undeflected path 204.

Figure 4:
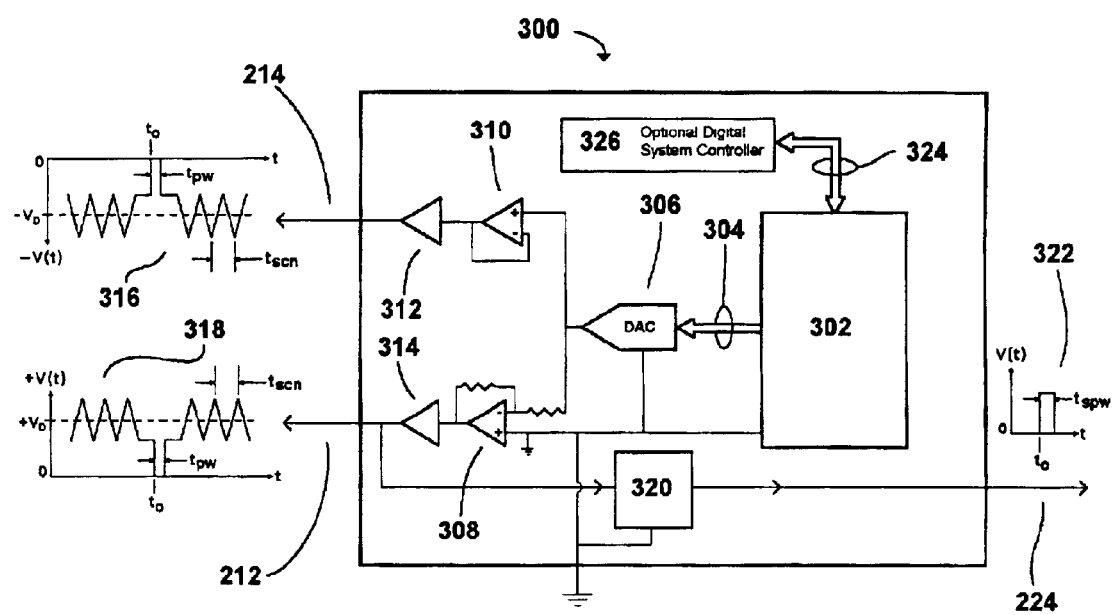
FIG. 4 is a schematic of a scan generator for y-scan plates having beam-switching provision according to the invention.

FIG. 4 shows details of scan generator 300 and of the signals it produces. The scan generator 300 produces scanning, deflection, and beam switching signals for y-scan plates 202 and produces synchronization signals for use by the time-of-flight analysis system 400. A digital sequence generator 302 produces sequences of binary number and control signals that flow to a digital-to-analog converter (DAC) 306 through signal bus 304. The digital sequence generator 302 may consist of a microprocessor, microcontroller, small computer, or other digital logic system capable of generating the necessary digital number sequences and control signals for the DAC 306. It is easily appreciated that the digital sequence generator and its control may be implemented by any of a variety of techniques that are well known to those skilled in the art of digital and computer logic. The digital sequence generator may furthermore communicate by way of a communication bus 324 with an optional remote digital system controller 326. Although such a digital system controller may be part of an overall automated control system for a GCIB processing apparatus and may be desirable from a point of convenience and efficiency in integrating and coordinating the functions of a GCIB processor, it is not a necessary part of the invention. Accordingly, the digital system controller 326 and the communication bus 324 are shown for purposes of example and not for limitation.

Still referring to FIG. 4, the binary number sequences and control signals provided by the digital sequence generator 302 enable the DAC 306 to produce a y-scanning signal that is amplified by inverting amplifier 308 and non-inverting amplifier 310 and by high-voltage amplifiers 312 and 314 to produce high level scanning signals 316 and 318 which are connected to the y-scan plates 202 by leads 214 and 212 respectively. During normal processing operations, the scan generator 300 produces a periodic saw-tooth waveform for each plate, having a period, $t_{scn}$, (which could, for example, but without limitation, be on the order of 1 to 100 milliseconds) and an amplitude suitable to produce the desired scan angle 226. Consider the scanning signal 318: The periodic saw-tooth waveform is superimposed on a DC deflection voltage, $V_D$, which is chosen to impose a fixed offset angle 210 between the initial beam trajectory 154 and the central path 206 of the scanned GCIB 148 as the beam travels through the region between the scan plates 202.

From time to time as required, either at least once before the start of GCIB processing, or preferably, repeatedly during GCIB processing, the digital sequence generator intersperses a beam switching pulse among the periodic saw-tooth scan waves. The timing of the waveform segments shown in the plots for signals 316 and 318 is chosen to include one such beam switching pulse. In the illustrated scanning signals, 316 and 318, the onset of the beam switching pulse is labeled $t_0$ and the duration of the beam switching pulse is labeled $t_{pw}$. During the beam switching pulse duration, the y-scanning signal voltage is zero, and for that reason, the GCIB is not deflected by offset angle 210 and is not scanned through scan angle 226, but, rather, travels undeflected through the region of y-scan plates 202 along the straight line path 204, which is an extension of the initial beam trajectory 154. Accordingly the undeflected GCIB flies in a straight line to the Faraday enclosure 222, where it is stopped and the charge in the ions is converted into a detected current which flows into time-of-flight analyzer 400 through lead 220. At time $t_0+t_{pw}$, the beam switching pulse ends, periodic saw-tooth scanning begins, the beam switches back to the offset path which is directed at the workpiece 152 and GCIB processing resumes. Note that scanning signal 316 is the negative of scanning signal 318. A sample of the scanning signal 308 is conducted to pulse shaping circuit 320. Pulse shaping circuit processes the scanning signal to extract and provide a synchronization pulse signal 322 which has a leading edge occurring at time $t_0$, synchronous with the onset of the beam switching pulse to the scan plates 202. The synchronization pulse signal 322 is shown, for example, but not for limitation, to have a pulse duration equal to $t_{spw}$, which may be equal to or different from $t_{pw}$. Synchronization pulse signal 322 is conducted by lead 224 to the time-of-flight analyzer 400. During the beam switching pulse duration, $t_{pw}$, molecular ions and cluster ions entering the entrance receive no deflection and so form a pulse of ions directed toward the Faraday enclosure 222. The undeflected ion pulse may contain molecular ions and cluster ions of various masses and correspondingly various velocities. As the ions fly toward the Faraday enclosure 222, their velocity differences cause them to become dispersed along the path 204 to the Faraday enclosure 222 and the ion pulse becomes extended. Consequently, the arrival times of the ions at the entrance to the Faraday enclosure 222 are delayed by different amounts related to their velocities.

Figure 5:
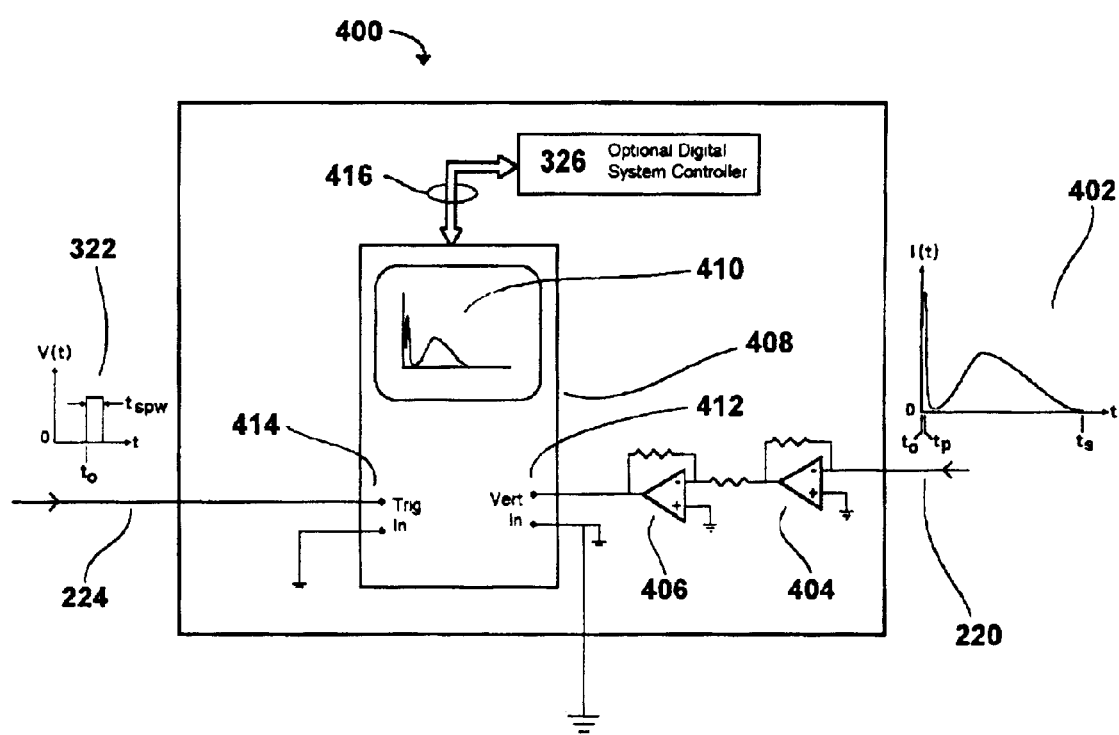
FIG. 5 is a schematic of a time-of-flight analyzer system of the invention.

FIG. 5 shows one embodiment of a time-of-flight analyzer 400 to be used in the invention. The arrival of the electrically charged ions in the Faraday enclosure 222 results in a corresponding current waveform induced in lead 220 to the time-of-flight analyzer 400. A short delay time, $t_p$, after $t_0$, the lightest, fastest ions arrive at the Faraday enclosure and are converted to an electrical current signal. According to their dispersion, the heavier, slower ions arrive later, with the heaviest, slowest ions arriving at the delayed time, $t_s$. The total current signal 402 collected by the Faraday enclosure as a result of the flight of a single dispersed ion pulse resulting from a single beam switching pulse may appear, for example, as shown the time amplitude plot 402 (current signal) in FIG. 5. In the example chosen for illustration of the principle, there is a current peak at time $t_p$ corresponding to the prompt arrival of the molecular ions and a broader peak occurring between $t_p$ and $t_s$ corresponding to the arrival of the slower cluster ions. Current-to-voltage converter 404 receives the current signal 402 and produces a voltage signal subsequently amplified by amplifier 406. The time-of-flight analyzer 400 also receives a synchronization pulse signal 322 conducted by lead 224 from scan generator 300. A digital storage oscilloscope 408, having a trigger signal input 414, at least one vertical signal input 412, internal time base generator for generating a display sweep signal, and a visual display 410 receives the synchronization pulse signal 322 and the amplified voltage signal derived from the current signal 402. Oscilloscope digitizes, stores, and displays the signal presented at vertical input 412, which is a time-of-flight spectrum for the ions in the single beam pulse resulting from one beam switching pulse.

Oscilloscope 410 may also have data communications capabilities and remote readout capabilities and may communicate by way of a communication bus 416 with an optional digital system controller 326. Although such a digital system controller may be part of an overall automated control system for a GCIB processing apparatus and may be desirable from a point of convenience and efficiency in integrating and coordinating the functions of a GCIB processor, it is not a necessary part of the invention. Accordingly, the digital system controller 326 and the communication bus 324 are shown for purposes of example and not for limitation. When an optional digital system controller is employed, is often has sufficient computational power to permit more sophisticated analysis and processing of the information in the time-of-flight signal.

Figure 6:
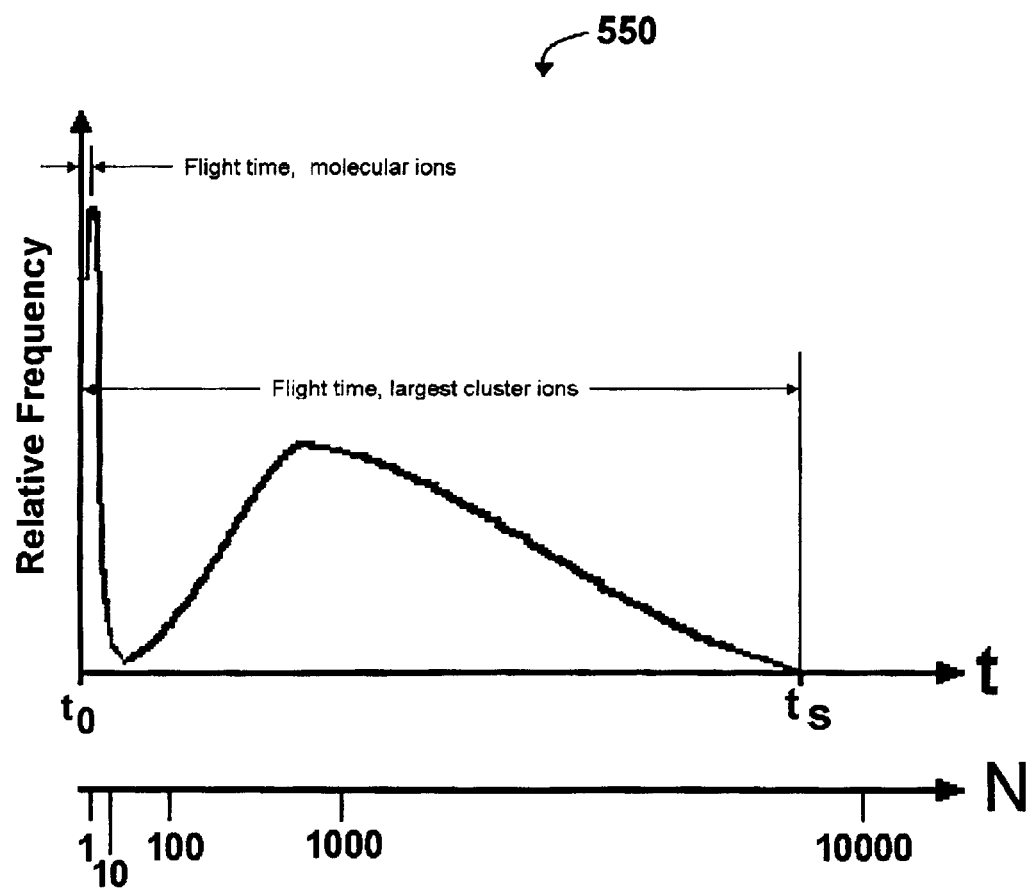
FIG. 6 is a time-of-flight spectrum as can be shown on the time-of-flight analyzer display of the invention.

The time of flight resolution of the current signal 402 is dependent on the flight distance D and the duration of the beam switching pulse $t_{pw}$ for a given beam energy. It is preferable that the duration of the beam switching pulse be shorter by at least a factor of 10 than the flight time of the ions over the distance D. With a short $t_{pw}$, the current signal 402 approaches the true time-of-flight spectrum. With longer values of $t_{pw}$, the beam switching pulse duration $t_{pw}$ becomes mathematically convolved with the time-of-flight spectrum. In such a case, it must be deconvolved in order to provide a spectrum with acceptable time-of-flight resolution. It is preferable that the duration of the beam switching pulse width $t_{pw}$ be less than one tenth of the time-of-flight of the lightest ion for which good resolution is desired. When $t_{pw}$ is short compared to the flight time of the molecular ions, the oscilloscope display 410 will have good resolution for even the molecular ions, and a time-of-flight spectrum 550 such as shown in FIG. 6 is produced on the display 410.

When $t_{pw}$ is short compared to the time-of-flight, the ion or cluster ion mass is related to the time-of-flight as follows:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \qquad \text{(Eqn. 1)}$$

where $m_i$=mass of ion (or cluster ion)
E=GCIB energy
v=velocity of ion (or cluster ion)
D=ion (or cluster ion) flight distance
$t_d=t-t_0$=ion (or cluster ion) time of flight
$V_{ACC}$=total beam acceleration potential
q=cluster charge state
e=unit charge (electronic charge) and $$N = \frac{m_i}{m_m} \qquad \text{(Eqn. 2)}$$

where N=cluster size
$m_i$=mass of ion (or cluster ion)
$m_m$=mass of a molecule of the gas forming clusters
Using Eqn. 2 and the value of $m_i$ from Eqn. 1 it is possible to determine the relationship between $t_d$, the time of flight of a cluster ion and its cluster size, thus making it possible to label the x-axis of the display 550 shown on the display 410 in units of cluster size, N, as well as in time-of-flight time units.

When the ionized clusters all bear a single charge equal in magnitude to the unit charge (electronic charge), e, then q=1 and Eqn. 1 and Eqn. 2 calculate the cluster size N. However, in general the ionized clusters may have a distribution in both size N and in charge state q, q being the number of electronic charges held by the ion. At the present, there is no easy separation of these distributions. Consequently in this case the time-of-flight measurement is used to measure the distribution of N':

$$N' = \frac{N}{q} \quad \text{(Eqn. 3)}$$

where q=cluster charge state.

While this generalization somewhat reduces the utility of the measurement, the time-of-flight derived N' distribution is very useful in determining consistency of operation in commercial production equipment and for facilitating the set-up of equipment operating parameters to achieve consistent processing. Moreover, it is often possible to infer the size distribution separately by operating the cluster ionizer at low levels so that it is unlikely that the clusters acquire more than a single charge each—in such case the approximation that q=e (ions are singly ionized) is justified.

The GCIB processing system 200 shown in FIG. 3 incorporates an embodiment of the invention which although operable, may be viewed as having a minor drawback. As drawn in FIG. 3, straight-line path 204 passes very near to the x-scan plates 132. As a result the pulses of GCIB that are undeflected by scan plates 202 and therefore travel along straight line path 204 may be influenced by any x-scanning electrical field between the x-scan plates 132, causing the GCIB pulse which was not deflected at plates 202 to receive a small amount of scanning at scan plates 132. This condition may be tolerated by choosing the shape Faraday enclosure 222 to have a shape that is elongated in the x-scan direction so as to collect all of the GCIB pulse even though it is somewhat extended in the x-scanning axis direction. Alternatively, the condition of concern, namely that the straight line path 204 passes near to the x-scan plates 132, can be avoided by increasing the fixed offset angle 210, or by increasing the spacing between scan plates 202 and scan plates 132 by moving scan plates 132 further downstream the central beam path 206. Although these are various means to deal with the proximity of the straight-line path to the x-scan plates 132, FIG. 7 shows an alternate embodiment of the invention, which avoids the problem in a different way.

Figure 7:
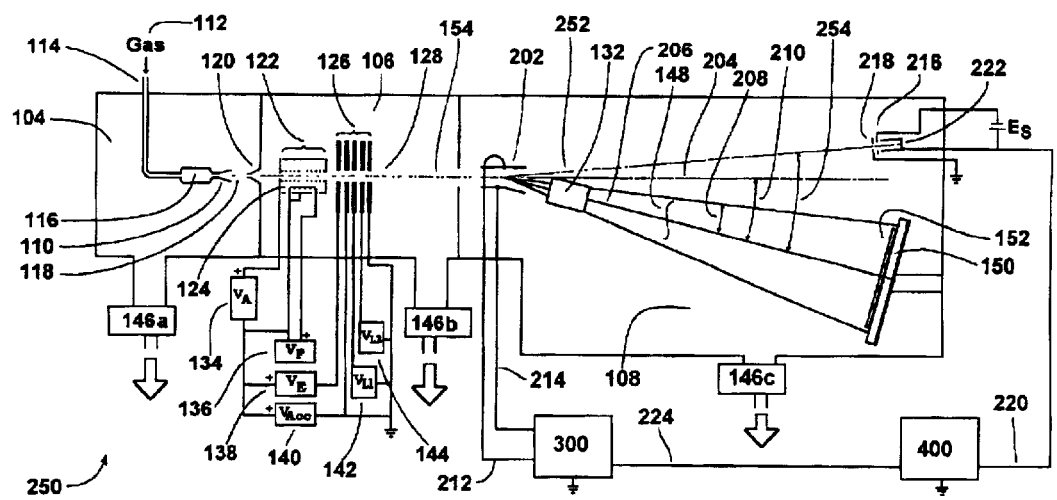
FIG. 7 shows a schematic of a GCIB processing system employing an alternative embodiment of the invention.

The GCIB processing system 250 shown in FIG. 7 is similar to the GCIB processing system 200 shown in FIG. 3 except that rather than disposing the Faraday enclosure 222 along the straight line path 204, which is an extension of the initial beam trajectory 154, it is instead disposed along a deflected path 252 which is deflected away from the central path 206 by a separation angle 254 that is greater than the offset angle 210 by an amount that separates the deflected path 252 from the x-scan plates 132 sufficiently for the beam pulse traveling along the deflected path 252 to avoid any scanning effects from x-scan plates 132. Such deflection can be achieved by utilizing a scanning signal 500 as shown in FIG. 8.

Figure 8:
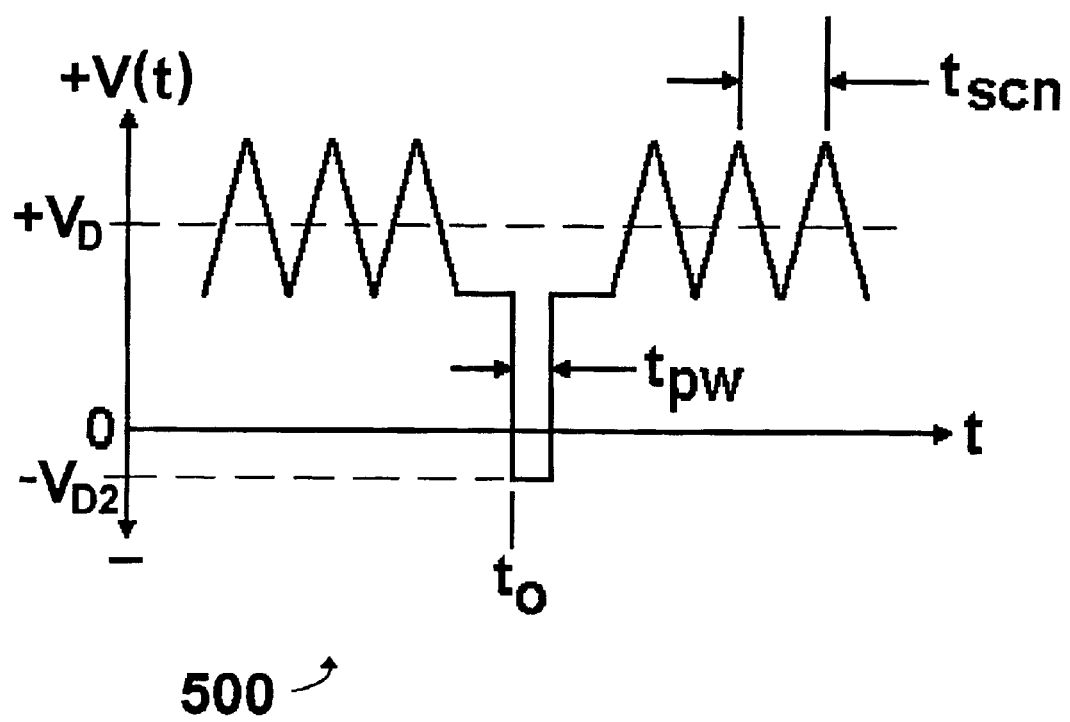
FIG. 8 shows a positive scanning signal for an alternate embodiment of the GCIB processing system of this invention, having a deflected time-of-flight analysis beam path.

In FIG. 8, note that the scanning signal 500 is identical to the scanning signal 318 shown for the first embodiment except that the beam switching pulse switches to a value of $-V_{D2}$ rather than zero. The negative value of $-V_{D2}$ causes the switched beam pulse to travel along deflected path 252 rather than along straight-line path 204. Scanning signal 500 represents the positive scanning signal applied to lead 212. Of course, there is a corresponding signal that is the negative of the scanning signal 500, which is generated and placed on lead 214. Scan generator 300 can generate signal 500 and its negative provided that the DAC 306, amplifiers 308, 310, 312, and 314 all have bipolar output capabilities and provided that the digital sequence generator 302 generates the corresponding digital sequences having negative values for the beam switching pulse period.

Once gas cluster ion beam cluster mass and/or cluster size and/or cluster size per charge and/or cluster mass per charge is determined by the present invention as described in the various embodiments set forth above, appropriate adjustments (for example adjusting source gas flow or adjusting ionizer filament voltage VF or anode voltage VA) can be made to the GCIB apparatus via conventional manual operator controls or via conventional feedback circuitry connected to conventional automation controls in order to maintain preferred gas cluster ion beam cluster mass and/or cluster size and/or cluster size or mass per charge during workpiece processing to assure proper quality or rate of processing, and thereby improving the processing of the workpiece. Alternatively, during workpiece processing, gas cluster ion beam cluster characteristics may be determined to assure proper continued workpiece processing. Should cluster characteristics drift out of desired specifications, conventional control and alarm circuitry can suspend processing and signal for operator attention to restore proper processing conditions, and thereby improve the processing of the workpiece.

Although the invention has been described with respect to various embodiments, it should be realized this invention is also capable of a wide variety of further and other embodiments within the scope of the claims.

What is claimed is:

1. An apparatus for gas cluster ion beam (GCIB) mass or cluster size diagnostics for improving GCIB workpiece processing, comprising:
   a vacuum vessel;
   a gas cluster ion beam source within the vacuum vessel for producing a gas cluster ion beam;
   an accelerator for accelerating the gas cluster ion beam along a first trajectory;
   a beam deflector for controllably deflecting the gas cluster ion beam along a second trajectory, said second trajectory diverging from said first trajectory by a predetermined offset angle;
   beam detection means disposed along said first trajectory at a predetermined distance, D, from said beam deflector;
   workpiece holding means disposed along the second trajectory for holding a workpiece for gas cluster ion beam processing;
   control means for providing deflection signals to said beam deflector for controllably deflecting the gas cluster ion beam between said first trajectory and said second trajectory, wherein the deflection signals comprise a beam switching signal that switches a beam pulse along said first trajectory in order to measure the times-of-flight of components of the gas cluster ion beam over said distance, D;
   time-of-flight measurement means for measuring the times-of-flight of components of the gas cluster ion beam over said distance, D; and
   a time-of-flight analyzer to analyze said times of flight of components of the gas cluster ion beam in order to provide output information relative to GCIB mass or cluster size;
   wherein said output information is used in the gas cluster ion beam processing of the workpiece.

2. The apparatus of claim 1, further comprising display means for displaying the times-of-flight of components of the gas cluster ion beam.

3. The apparatus of claim 1, further comprising display means for displaying an estimate of the size or mass distribution of cluster components of the gas cluster ion beam based upon said output information.

4. The apparatus of claim 1, further comprising system control means operably connected to said time-of-flight analyzer for receiving output information and for controlling the gas cluster ion beam processing of the workpiece.

5. The apparatus of claim 1, wherein the beam detection means comprises a faraday enclosure for collecting beam current signals.

6. The apparatus of claim 1, wherein the accelerator accelerates the gas cluster ion beam to an energy in the range of from about 1 keV to about 50 keV.

7. The apparatus of claim 6, wherein the time duration of the beam switching signal is less than 10% of the time-of-flight for ions of size N being 500 or greater.

8. The apparatus of claim 1, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad (\text{Eqn. 1})$$

where $m_i$=mass of ion (or cluster ion)
E=GCIB energy
v=velocity of ion (or cluster ion)
D=ion (or cluster ion) flight distance
$t_d$=t−$t_0$=ion (or cluster ion) time of flight
$V_{ACC}$=total beam acceleration potential
q=1=cluster charge state
e=unit charge (electronic charge) and $$N = \frac{m_i}{m_m} \quad (\text{Eqn. 2})$$

where N=cluster size
$m_i$=mass of ion (or cluster ion)
$m_m$=mass of a molecule of the gas forming clusters.

9. The apparatus of claim 1, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad (\text{Eqn. 1})$$

where $m_i$=mass of ion (or cluster ion)
E=GCIB energy
v=velocity of ion (or cluster ion)
D=ion (or cluster ion) flight distance
$t_d$=t−$t_0$=ion (or cluster ion) time of flight
$V_{ACC}$=total beam acceleration potential
q=cluster charge state
e=unit charge (electronic charge) and $$N = \frac{m_i}{m_m} \quad (\text{Eqn. 2})$$

where N=cluster size
$m_i$=mass of ion (or cluster ion)
$m_m$=mass of a molecule of the gas forming clusters and $$N' = \frac{N}{q} \quad (\text{Eqn. 3})$$

where q=cluster charge state.

10. An apparatus for gas cluster ion beam (GCIB) mass or cluster size diagnostics for improving GCIB workpiece processing, comprising:
a vacuum vessel;
a gas cluster ion beam source within the vacuum vessel for producing a gas cluster ion beam;
an accelerator for accelerating said gas cluster ion beam along a first trajectory;
a beam deflector for controllably deflecting the gas cluster ion beam along a second trajectory said second trajectory diverging from said first trajectory by a predetermined first offset angle, and for controllably deflecting the gas cluster ion beam along a third trajectory, said third trajectory diverging from said second trajectory by a predetermined second offset angle greater than said predetermined first offset angle;
beam detection means disposed along the third trajectory at a predetermined distance, D, from the beam deflector;
workpiece holding means disposed along said second trajectory for holding a workpiece for gas cluster ion beam processing;
control means for providing deflection signals for controllably deflecting the gas cluster ion beam between said second trajectory and said third trajectory;
time-of-flight measurement means for measuring the times-of-flight of components of the gas cluster ion beam over said distance, D; and
a time-of-flight analyzer to analyze said times of flight of components of the gas cluster ion beam in order to provide output information relative to GCIB mass or cluster size;
wherein said output information is used in the gas cluster ion beam processing of the workpiece.

11. The apparatus of claim 10, further comprising display means for displaying the times-of-flight of components of the gas cluster ion beam.

12. The apparatus of claim 10, further comprising display means for displaying an estimate of the size or mass distribution of cluster components of the gas cluster ion beam based upon said output information.

13. The apparatus of claim 10, further comprising system control means operably connected to said time-of-flight analyzer for receiving output information and for controlling the gas cluster ion beam processing of the workpiece.

14. The apparatus of claim 10, wherein the beam detection means comprises a faraday enclosure for collecting beam current signals.

15. The apparatus of claim 10, wherein the deflection signals comprise a beam switching signal that switches a beam pulse along said third trajectory in order to measure the times-of-flight of components of the gas cluster ion beam over said distance, D.

16. The apparatus of claim 15, wherein the accelerator accelerates the gas cluster ion beam to an energy in the range of from about 1 keV to about 50 keV.

17. The apparatus of claim 16, wherein the time duration of the beam switching signal is less than 10% of the time-of-flight for ions of size N being 500 or greater.

18. The apparatus of claim 10, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad (\text{Eqn. 1})$$

where $m_i$=mass of ion (or cluster ion)
E=GCIB energy
v=velocity of ion (or cluster ion)

D=ion (or cluster ion) flight distance
$t_d=t-t_0$ ion (or cluster ion) time of flight
$V_{ACC}$=total beam acceleration potential
q=1=cluster charge state
e=unit charge (electronic charge) and $$N = \frac{m_i}{m_m} \quad \text{(Eqn. 2)}$$

where N=cluster size
$m_i$=mass of ion (or cluster ion)
$m_m$=mass of a molecule of the gas forming clusters.

19. The apparatus of claim 10, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad \text{(Eqn. 1)}$$

where $m_i$=mass of ion (or cluster ion)
E=GCIB energy
v=velocity of ion (or cluster ion)
D=ion (or cluster ion) flight distance
$t_d=t-t_0$=ion (or cluster ion) time of flight
$V_{ACC}$=total beam acceleration potential
q=cluster charge state
e=unit charge (electronic charge) and $$N = \frac{m_i}{m_m} \quad \text{(Eqn. 2)}$$

where N=cluster size
$m_i$=mass of ion (or cluster ion)
$m_m$=mass of a molecule of the gas forming clusters and $$N' = \frac{N}{q} \quad \text{(Eqn. 3)}$$

where q=cluster charge state.

20. An apparatus for gas cluster ion beam (GCIB) mass or cluster size diagnostics for improving GCIB workpiece processing, comprising:
  a vacuum vessel;
  a gas cluster ion beam source within the vacuum vessel for producing a gas cluster ion beam;
  an accelerator for accelerating the gas cluster ion beam along a first trajectory;
  a beam deflector for controllably deflecting the gas cluster ion beam along a second trajectory, said second trajectory diverging from said first trajectory by a predetermined offset angle;
  beam detection means disposed along said first trajectory at a predetermined distance, D, from said beam deflector;
  control means for providing deflection signals to said beam deflector for controllably deflecting the gas cluster ion beam between said first trajectory and said second trajectory;
  time-of-flight measurement means for measuring the times-of-flight of components of the gas cluster ion beam over said distance, D; and
  a time-of-flight analyzer to analyze said times of flight of components of the gas cluster ion beam in order to provide output information relative to GCIB mass or cluster size, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad \text{(Eqn. 1)}$$

where $m_i$=mass of ion (or cluster ion)
E=GCIB energy
v=velocity of ion (or cluster ion)
D=ion (or cluster ion) flight distance
$t_d=t-t_0$=ion (or cluster ion) time of flight
$V_{ACC}$=total beam acceleration potential
q=1=cluster charge state
e=unit charge (electronic charge) and $$N = \frac{m_i}{m_m} \quad \text{(Eqn. 2)}$$

where N=cluster size
$m_i$=mass of ion (or cluster ion)
$m_m$=mass of a molecule of the gas forming clusters.

21. The apparatus of claim 20, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad \text{(Eqn. 1)}$$

where $m_i$=mass of ion (or cluster ion)
E=GCIB energy
v=velocity of ion (or cluster ion)
D=ion (or cluster ion) flight distance
$t_d=t-t_0$=ion (or cluster ion) time of flight
$V_{ACC}$=total beam acceleration potential
q=cluster charge state
e=unit charge (electronic charge) and $$N = \frac{m_i}{m_m} \quad \text{(Eqn. 2)}$$

where N=cluster size
$m_i$=mass of ion (or cluster ion)
$m_m$=mass of a molecule of the gas forming clusters and $$N' = \frac{N}{q} \quad \text{(Eqn. 3)}$$

where q=cluster charge state.

22. An apparatus for gas cluster ion beam (GCIB) mass or cluster size diagnostics for improving GCIB workpiece processing, comprising:
  a vacuum vessel;
  a gas cluster ion beam source within the vacuum vessel for producing a gas cluster ion beam;

an accelerator for accelerating said gas cluster ion beam along a first trajectory;

a beam deflector for controllably deflecting the gas cluster ion beam along a second trajectory said second trajectory diverging from said first trajectory by a predetermined first offset angle, and for controllably deflecting the gas cluster ion beam along a third trajectory, said third trajectory diverging from said second trajectory by a predetermined second offset angle greater than said predetermined first offset angle;

beam detection means disposed along the third trajectory at a predetermined distance, D, from the beam deflector, control means for providing deflection signals for controllably deflecting the gas cluster ion beam between said second trajectory and said third trajectory;

time-of-flight measurement means for measuring the times-of-flight of components of the gas cluster ion beam over said distance, D; and a time-of-flight analyzer to analyze said times of flight of components of the gas cluster ion beam in order to provide output information relative to GCIB mass or cluster size;

wherein said output information is used in the gas cluster ion beam processing of the workpiece.

23. The apparatus of claim 22, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \qquad \text{(Eqn. 1)}$$

where $m_i$=mass of ion (or cluster ion)
E=GCIB energy
v=velocity of ion (or cluster ion)
D=ion (or cluster ion) flight distance
$t_d$=t−$t_0$=ion (or cluster ion) time of flight
$V_{ACC}$=total beam acceleration potential
q=1=cluster charge state
e=unit charge (electronic charge) and $$N = \frac{m_i}{m_m} \qquad \text{(Eqn. 2)}$$

where N=cluster size
$m_i$=mass of ion (or cluster ion)
$m_m$=mass of a molecule of the gas forming clusters.

24. The apparatus of claim 22, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \qquad \text{(Eqn. 1)}$$

where $m_i$=mass of ion (or cluster ion)
E=GCIB energy
v=velocity of ion (or cluster ion)
D=ion (or cluster ion) flight distance
$t_d$=t−$t_0$=ion (or cluster ion) time of flight
$V_{ACC}$=total beam acceleration potential q=cluster charge state
e=unit charge (electronic charge) and $$N = \frac{m_i}{m_m} \qquad \text{(Eqn. 2)}$$

where N=cluster size
$m_i$=mass of ion (or cluster ion)
$m_m$=mass of a molecule of the gas forming clusters and $$N' = \frac{N}{q} \qquad \text{(Eqn. 3)}$$

where q=cluster charge state.

25. A method for gas cluster ion beam (GCIB) mass or cluster size diagnostics for improving GCIB workpiece processing, comprising:

providing a gas cluster ion beam source;

producing a gas cluster ion beam with said ion beam source;

accelerating the gas cluster ion beam along a first trajectory;

controllably deflecting the gas cluster ion beam between said first trajectory and said second trajectory, said second trajectory being offset from said first trajectory by a predetermined offset angle;

defining a predetermined distance, D, along said first trajectory;

controllably switching the gas cluster ion beam pulse along said first trajectory;

detecting the gas cluster ion beam along said first trajectory at said predetermined distance, D;

measuring the times-of-flight of components of the gas cluster ion beam over said distance, D; and analyzing said times of flight of components of the gas cluster ion beam in order to provide output information relative to GCIB mass or cluster size.

26. The method of claim 25, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \qquad \text{(Eqn. 1)}$$

where $m_i$=mass of ion (or cluster ion)
E=GCIB energy
v=velocity of ion (or cluster ion)
D=ion (or cluster ion) flight distance
$t_d$=t−$t_0$=ion (or cluster ion) time of flight
$V_{ACC}$=total beam acceleration potential
q=1=cluster charge state
e=unit charge (electronic charge) and $$N = \frac{m_i}{m_m} \qquad \text{(Eqn. 2)}$$

where N=cluster size m$_i$=mass of ion (or cluster ion)

m$_m$=mass of a molecule of the gas forming clusters.

27. The apparatus of claim 25, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad \text{(Eqn. 1)}$$

where m$_i$=mass of ion (or cluster ion)

E=GCIB energy v=velocity of ion (or cluster ion)

D=ion (or cluster ion) flight distance t$_d$=t−t$_0$=ion (or cluster ion) time of flight V$_{ACC}$=total beam acceleration potential q=cluster charge state e=unit charge (electronic charge) and $$N = \frac{m_i}{m_m} \quad \text{(Eqn. 2)}$$

where N=cluster size m$_i$=mass of ion (or cluster ion)

m$_m$=mass of a molecule of the gas forming clusters and $$N' = \frac{N}{q} \quad \text{(Eqn. 3)}$$

where q=cluster charge state.

28. The method of claim 25, further comprising:

situating a workpiece in a predetermined location within said second trajectory; and using said output information relative to GCIB mass or cluster size to improve processing the workpiece.

29. A method for gas cluster ion beam (GCIB) mass or cluster size diagnostics for improving GCIB workpiece processing, comprising:

providing a gas cluster ion beam source;

producing a gas cluster ion beam with said ion beam source;

accelerating the gas cluster ion beam along a first trajectory;

controllably deflecting the gas cluster ion beam between said second trajectory and a third trajectory, said second trajectory being offset from said first trajectory by a predetermined first offset angle and said third trajectory being offset from said second trajectory by a second predetermined offset angle, said second offset angle being greater than said first offset angle;

defining a predetermined distance, D, along said third trajectory;

detecting the gas cluster ion beam along said third trajectory at said predetermined distance, D;

measuring the times-of-flight of components of the gas cluster ion beam over said distance, D; and analyzing said times of flight of components of the gas cluster ion beam in order to provide output information relative to GCIB mass or cluster size.

30. The method of claim 29, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad \text{(Eqn. 1)}$$

where m$_i$=mass of ion (or cluster ion)

E=GCIB energy v=velocity of ion (or cluster ion)

D=ion (or cluster ion) flight distance t$_d$=t−t$_0$=ion (or cluster ion) time of flight V$_{ACC}$=total beam acceleration potential q=1=cluster charge state e=unit charge (electronic charge) and $$N = \frac{m_i}{m_m} \quad \text{(Eqn. 2)}$$

where N=cluster size m$_i$=mass of ion (or cluster ion)

m$_m$=mass of a molecule of the gas forming clusters.

31. The apparatus of claim 29, wherein the output information relative to GCIB mass or cluster size is ascertained by the following formula:

$$m_i = \frac{2E}{v^2} = \frac{2E}{\left(\frac{D}{t_d}\right)^2} = \frac{2E(t_d)^2}{D^2} = \frac{2qeV_{ACC}(t_d)^2}{D^2} \quad \text{(Eqn. 1)}$$

where m$_i$=mass of ion (or cluster ion)

E=GCIB energy v=velocity of ion (or cluster ion)

D=ion (or cluster ion) flight distance t$_d$=t−t$_0$=ion (or cluster ion) time of flight V$_{ACC}$=total beam acceleration potential q=cluster charge state e=unit charge (electronic charge) and $$N = \frac{m_i}{m_m} \quad \text{(Eqn. 2)}$$

where N=cluster size m$_i$=mass of ion (or cluster ion)

m$_m$=mass of a molecule of the gas forming clusters and $$N' = \frac{N}{q} \quad \text{(Eqn. 3)}$$

where q=cluster charge state.

32. The method of claim 29, further comprising:

situating a workpiece in a predetermined location within said second trajectory; and using said output information relative to GCIB mass or cluster size to improve processing the workpiece.

* * * * *